(12) United States Patent
Fleury et al.

(10) Patent No.: US 7,610,814 B2
(45) Date of Patent: Nov. 3, 2009

(54) MICROMECHANICAL DEVICE COMPRISING A MOBILE BEAM

(75) Inventors: Gatien Fleury, Grenoble (FR); Pierre-Louis Charvet, Saint-Martin-le-Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 222 days.

(21) Appl. No.: 11/794,807

(22) PCT Filed: Feb. 2, 2006

(86) PCT No.: PCT/FR2006/000246

§ 371 (c)(1),
(2), (4) Date: Jul. 6, 2007

(87) PCT Pub. No.: WO2006/084977

PCT Pub. Date: Aug. 17, 2006

(65) Prior Publication Data
US 2008/0148864 A1    Jun. 26, 2008

(30) Foreign Application Priority Data
Feb. 8, 2005    (FR) .................................. 05 01239

(51) Int. Cl.
*G01N 3/00* (2006.01)
(52) U.S. Cl. .......................................... 73/788; 73/760
(58) Field of Classification Search ........... 73/777–788, 73/769–860
See application file for complete search history.

(56) References Cited

U.S. PATENT DOCUMENTS

| 4,806,755 | A | * | 2/1989 | Duerig et al. ................... 850/7 |
| 6,073,484 | A | * | 6/2000 | Miller et al. ................... 73/105 |
| 6,218,762 | B1 | | 4/2001 | Hill et al. |
| 6,707,176 | B1 | * | 3/2004 | Rodgers ............... 310/40 MM |
| 6,784,771 | B1 | | 8/2004 | Fan |
| 6,925,888 | B2 | * | 8/2005 | Brossia et al. ................. 73/799 |
| 2002/0136485 | A1 | | 9/2002 | Reed et al. |
| 2005/0276726 | A1 | * | 12/2005 | McGill et al. ................. 422/96 |

FOREIGN PATENT DOCUMENTS

DE    100 61 205 A1    6/2002

OTHER PUBLICATIONS

Saif M., "On a Tunable Bistable MEMS-Theory and Experiment," Jun. 2000, Journal of Microelectromechanical Systems, vol. 9, No. 2, pp. 157-170.

* cited by examiner

*Primary Examiner*—Max Noori
(74) *Attorney, Agent, or Firm*—Oliff & Berridge, PLC

(57) ABSTRACT

The micromechanical device comprises a mobile beam attached via the two ends thereof to a rigid frame comprising two arms each having two ends. The ends of an arm are respectively secured to the two ends of the mobile beam. Each arm has a middle part arranged between the two ends of the corresponding arm. A rear face of the middle part of each arm is attached to a base support. The frame comprises at least one stressed element enabling the state of stress of the beam to be adjusted. The stressed element can be centered between the front face and the rear face of the corresponding arm. The frame can comprise pairs of front and rear stressed elements arranged facing one another respectively on the front face and on the rear face of the arms.

14 Claims, 3 Drawing Sheets

MICROMECHANICAL DEVICE COMPRISING A MOBILE BEAM

BACKGROUND OF THE INVENTION

The invention relates to a micromechanical device comprising a mobile beam attached via the two ends thereof to a rigid frame, the beam having a predetermined stressed state.

STATE OF THE ART

Micromechanical devices comprising a mobile beam enable resonators, variable capacitors, wide-deflection optical mirrors, non-volatile memories, force sensors, accelerometers, bistable or non-bistable microswitches, etc. to be produced. One of the major problems for operation, and also in production, of micromechanical devices comprising a mobile beam are the residual stresses, in particular in the beam. The residual stresses have repercussions for example on the actuating voltage of a switch and on the dependability of the device. In particular, the devices often require high actuating voltages. The residual stresses of the beam also influence the vertical deflection in the middle of the beam (its sag). The initial value of the sag determines the value of the variable capacitance of a capacitor or determines the contact force and stability of a bistable micro-switch. The state of stress of the beam is determined in particular by the residual stresses originating from the deposition methods of the materials used (the state of stress is also related to the geometry of the beam).

OBJECT OF THE INVENTION

The object of the invention is to remedy these shortcomings and in particular to provide a device wherein the required energy, for example the actuating voltage of an electrostatically-controlled micromechanical device or the actuating current of a device controlled by thermal dilatation, is reduced, and wherein the sag can be controlled.

According to the invention, this object is achieved by the fact that the frame comprises two arms each having two ends respectively secured to the two ends of the mobile beam and each having a middle part arranged between the two ends of the corresponding arm, the arms and the middle parts thereof presenting a front face and a rear face, the rear face of the middle part of each arm being attached to a base support, the frame comprising at least one stressed element enabling the state of stress of the beam to be adjusted.

The stressed element can be formed by a tensile or compressive stressed thin layer.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

Figure 1:
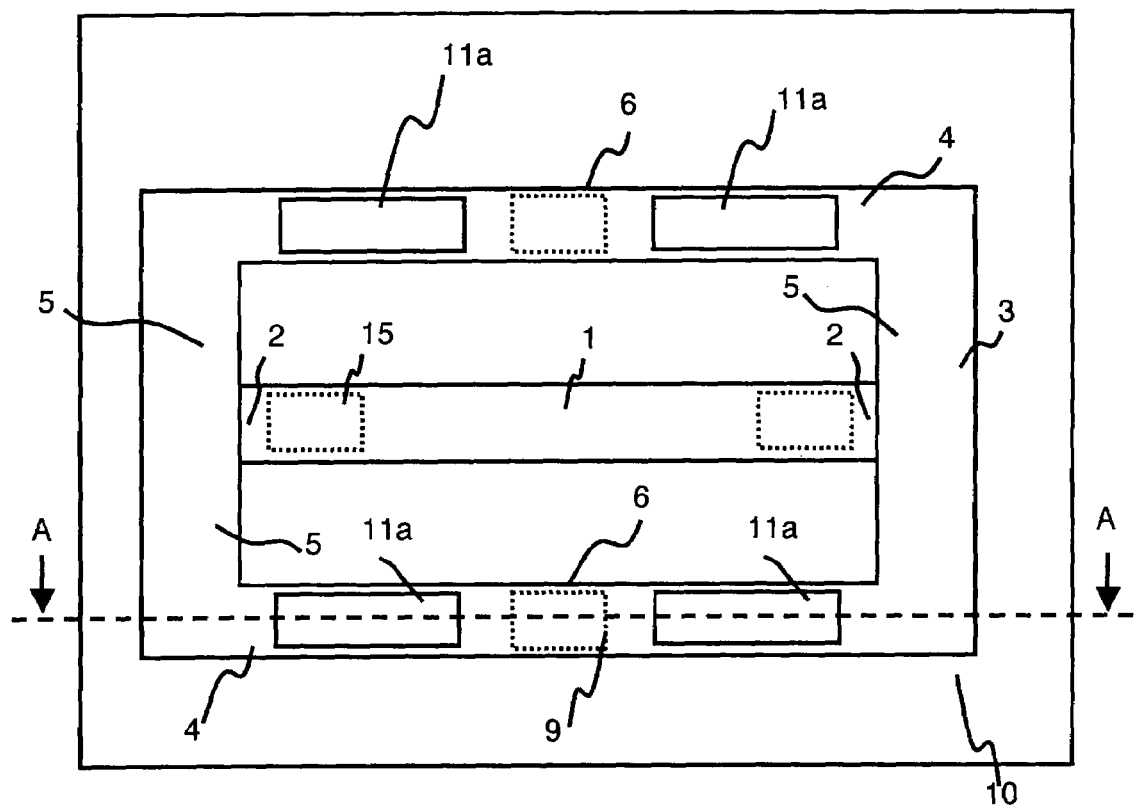
FIG. 1 illustrates a specific embodiment of a device according to the invention, in top view.

In FIG. 1, a micromechanical device comprises a mobile beam 1 attached via the two ends 2 thereof to a rigid frame 3, preferably a flat frame. The beam 1 is for example made of silicon dioxide ($SiO_2$), silicon nitride ($Si_3N_4$) or monocrystalline or polycrystalline silicon. The frame 3 can for example also be made of silicon dioxide ($SiO_2$), silicon nitride ($Si_3N_4$) or monocrystalline or polycrystalline silicon, possibly accompanied by a metal or by several metals or by a metal-based nitride compound, for example TaN or TiN, or by a piezoelectric material, for example AlN. In a specific embodiment, the frame 3 is formed by a layer of low stress-silicon dioxide (low stress $SiO_2$) obtained by a PECVD method which also forms the beam 1. The part of this layer which corresponds to the frame 3 can also comprise silicon nitride layers (deposited for example by high-frequency plasma deposition).

The frame 3 comprises two arms 4 each having two ends 5 respectively secured to the two ends 2 of the mobile beam 1. Each arm 4 has a middle part 6 arranged between the two ends 5 of the corresponding arm 4.

The frame 3 has to be rigid with respect to the mobile beam 1, i.e. the ability of the frame 3 to deform as a result of a stress applied by the beam 1 on the frame 3 is negligible. For example, when the beam 1 is under maximum stress when the micromechanical device is operating, the relative deformation of the frame 3 is less than 0.01%. The thickness of the frame 3 is for example three times greater than the thickness of the beam 1, and the width of each arm 4 is for example ten times greater than its thickness. The width of the beam 1 can be comparable to that of the arms 4 so that the cross-section of the arms 4 is about three times greater than that of the beam 1. In addition, the material of the arms 4 preferably presents a higher Young's modulus than the Young's modulus of the material of the beam 1. To achieve a bistable microswitch, the beam 1 typically has a length of 500 microns and a width of 50 microns, and the arms have a width of 100 microns.

Figure 2:
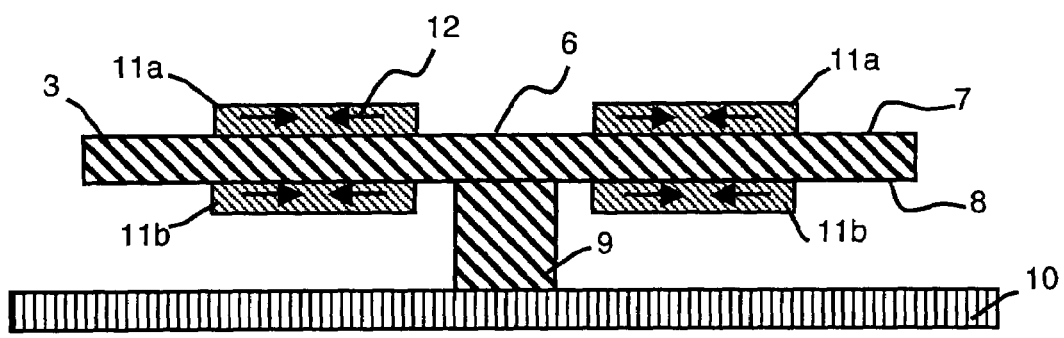
FIGS. 2 and 3 represent two specific embodiments of a device according to FIG. 1, in cross-section along the line A-A.

As represented in FIG. 2, the arms 4 of the frame 3 and the middle part 6 present a front face 7 and a rear face 8. The middle part 6 of each arm 4 can be arranged with said rear face 8 on a support block 9 securely affixed to a base support 10, so that the frame 3 and the beam 1 are separated from the base support 10. The base support 10 is for example flat.

In a first specific embodiment of the invention, the frame 3 comprises at least one pair of stressed elements 11, a front element 11a and a rear element 11b, arranged facing one another respectively on the front face 7 and on the rear face 8 of the arms 4. In FIG. 1, the frame 3 comprises four pairs of stressed elements 11, notably two pairs for each arm 4, respectively located on each side of the middle part 6 of the corresponding arm 4. In FIG. 2, two pairs of elements 11 are represented, front (11a) and rear (11b), arranged on the arms respectively on each side of the middle part 6 and therefore of the support block 9. A first pair of front (11a) and rear (11b) elements is disposed on the left in FIG. 2, and a second pair of front (11a) and rear (11b) elements is disposed on the right in FIG. 2.

The elements 11 enable the state of stress of the mobile beam 1 to be controlled, and therefore enable the compressive or tensile stress of the beam 1 to be adjusted. This in particular enables deformation of the beam 1 to be controlled.

The stressed elements 11 can be formed by tensile stressed thin layers or by compressive stressed thin layers. Each element 11 can also be formed by a stack of thin layers. The elements 11 represented in FIG. 2 are tensile stressed thin layers, as represented by arrows 12. Thus, when the beam 1 is subjected to a compressive stress, this compressive stress is increased, whereas the tensile stressing of the beam 1 is reduced by a tensile stress of the elements 11. For bistable switches, the beam 1 is preferably under a strong compression, which enables two very stable equilibrium states to be obtained. It should be noted that the beam then presents a longitudinal stress. The stress is adjusted before the main movement of the beam, i.e. the beam does not move when the stress is adjusted.

Two stable positions can be obtained by making the beam 1 buckle, which requires the force due to the compressive stresses of the beam 1 to be greater than Euler's first critical load. The compressive stresses are due on the one hand to the stresses proper to the beam 1, i.e. the residual stresses due to the deposition process, and on the other hand to the tensile stresses of the elements 11 of the frame 3, causing the compressive stress of the beam 1 to be increased.

When the elements 11 are arranged on the two faces of the arms 4, the front face 7 and the rear face 8, a bimetal type effect exerting a transverse force on the arms 4, is avoided. The stresses thus essentially create longitudinal forces in the arms 4. When the front element 11a of a pair of elements does not have the same thickness, the same residual stress and the same Young's modulus as the corresponding rear element 11b, the thicknesses of the elements 11a and 11b have to be adapted to prevent any bimetal type effect. To determine the thickness, a first value can be had by calculation using Hooke's law, known from continuous medium mechanics, a law which links the residual stress to the strain. Then the person skilled in the art can proceed by successive trials. The characteristics (modulus of elasticity, residual stresses) of materials deposited as a thin layer having a thickness of less than a micrometer are in fact not very well known. In all cases, a front force exerted on one of the arms 4 by the front element 11a of a pair of elements is preferably substantially equal to a rear force exerted on the same arm 4 by the corresponding rear element 11b. In order to adapt the front 11a and rear 11b elements, another envisageable solution is to include patterns located in the frame where the beam is embedded which will rigidify the elements 11, for example lines in the longitudinal direction of the arms 4.

Figure 3:
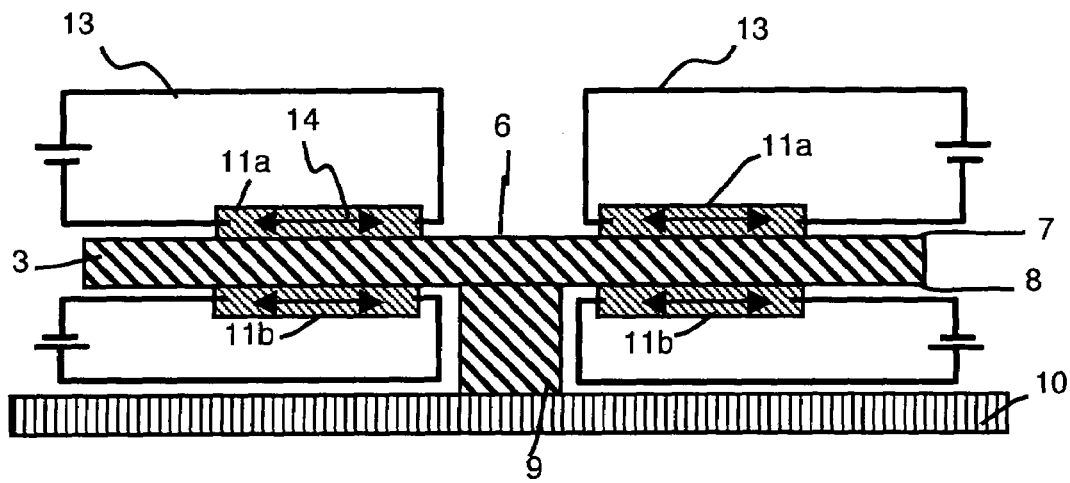

In an alternative embodiment, the stressed elements 11 can comprise first actuators. Preferably, each element 11 is formed by a first actuator, as represented in FIG. 3. The first actuators are disposed respectively on the front face 7 and on the rear face 8 of the arms 4. Thus, in this alternative embodiment, the front and rear elements 11 are active, whereas in the previously described embodiment, the front and rear elements 11 are passive.

The first actuators forming the elements 11 are in particular interesting in the case of bistable switches. The bistable switches may in addition comprise second actuators 15 for actuation of the beam 1, represented in FIG. 1. Actuation of the beam 1 by means of the second actuators 15, for example in the case of a microswitch, enables an electric contact to be established between conducting elements disposed respectively on a bottom face of the beam 1 and on the support 10.

The residual stresses when switching performed by the second actuators takes place can be relaxed by means of the first actuators. This prevents the appearance of high stresses which may result in breaking of the mobile beam 1. A bistable switch according to the invention enables a high contact force and a great stability of the equilibrium positions to be obtained while at the same time making switching possible. The switch then has a better resistance to the influences of the external environment, for example to impacts or external force or potential fields.

The first actuators of the elements 11 enable the stresses in the frame 3 to be modified, thereby reducing the internal compressive and tensile stresses of the beam 1. This facilitates switching of the switch from a first position to a second position. The first actuators are preferably chosen from thermal actuators, piezoelectric actuators and electrostatic, electrostrictive, electromagnetic and magnetostrictive actuators. The first actuators are for example actuators formed by thin layers.

In the case of piezoelectric actuators, the layers constituting the first actuators are for example made of aluminium nitride, of a compound comprising zirconium, titanium, lead and oxygen such as $Pb(Zr,Ti)O_3$ or of a compound comprising magnesium, zirconium, niobium, lead and oxygen such as $xPb(Mg_{1/3}Nb_{2/3})O_3-(1-x)PbTiO_3$. A device using two different types of actuators can be envisaged. In FIG. 3, electric power supplies 13 enable an electric voltage to be applied to the ends of each of the thin layers constituting the first actuators so as to obtain a stress, for example a compressive stress, illustrated by arrows 14. The stress can also be a tensile stress. When actuation takes place, a longitudinal lengthening or shortening of the arms 4 is obtained without causing a flexion in the direction of the support 10 or away from the support.

Thermal actuators are for example formed by metal layers. When an electric current flows through the metal layers, the volume of these layers increases enabling a tensile force to be exerted on the frame 3. A metal having a high thermal dilatation coefficient, a low heat capacity, a good temperature resistance and a high Young's modulus is preferably chosen. Advantageously, in the lithography step, this thin layer is given a particular shape that is able to increase the longitudinal deformation of the beam 1.

The beam 1 can for example comprise four second actuators 15, in particular two second actuators 15 located on the bottom face of the beam 1 and two second actuators 15 located on the top face of the beam 1, which enables the beam 1 to be actuated using the second actuators 15 only. In another alternative embodiment, the beam 1 only comprises two second actuators 15, which enables a stability position of the beam 1 to be privileged, for example a top position when two tensile stressed elements are placed on the top face of the beam 1 or a bottom position when two compressive stressed elements are placed on the top face of the beam 1. In the second case, the second actuators 15 and the first actuators have to be used to switch to a position of lesser stability, whereas, to switch to the highest stability position, the first actuators only have to be actuated.

Figure 4:
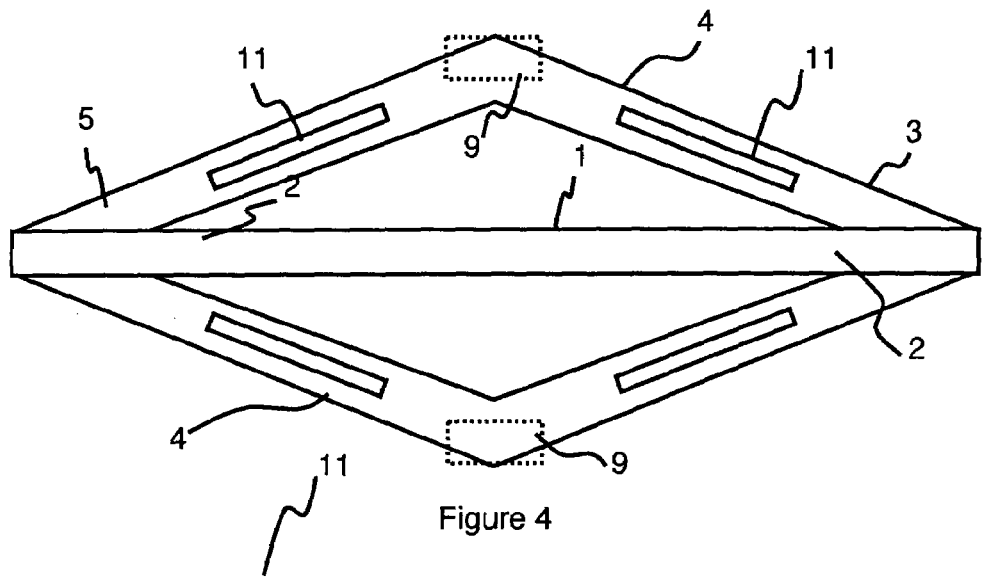
FIGS. 4 and 5 schematically represent two other specific embodiments of a device according to the invention, in top view.
Figure 5:
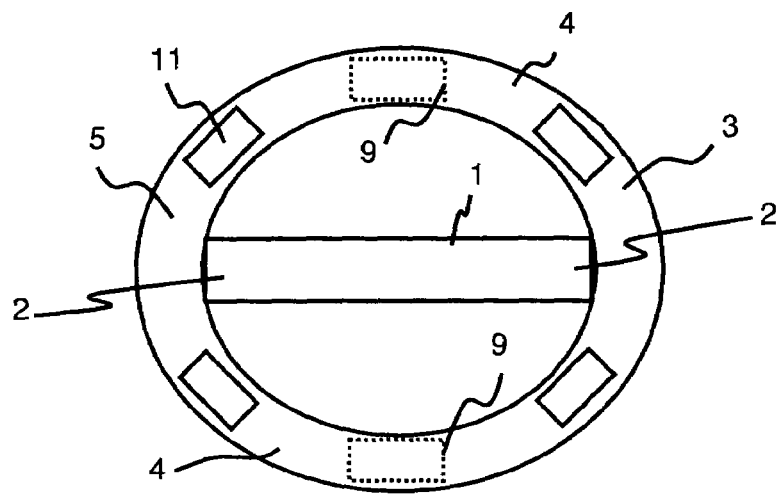

The device according to the invention can have any geometry. The frame 3 can thus, as represented in FIGS. 4 and 5, present the geometry of a rhomb or of a circle. The elements 11 can for example cover the whole of the arms 4 of the frame 3.

For resonators and variable capacitors, the resonance frequency and the initial value of the capacitance can respectively be adjusted. In the case of a force sensor, the triggering threshold can be adjusted. In a non-bistable switch, the actuating voltage can be adjusted and in particular decreased, which enables the electric actuating voltage to be reduced. All these adjustments can be made before or during operation of the devices.

A compressive stressed layer can for example be achieved by deposition of a silicon dioxide or silicon nitride-base layer deposited by low-frequency plasma deposition. A tensile stressed layer can be achieved by deposition of a silicon nitride (for example by low-frequency plasma deposition), of tantalum nitride (TaN) or titanium nitride (TiN) or of a metal, for example tantalum, platinum, gold, silver, aluminium, manganese, zinc and nickel or of a nickel-base alloy (for example inconel FeNiCr). Metals have the advantage of having a high thermal expansion coefficient, which implies a good expansion potential.

Figure 6:
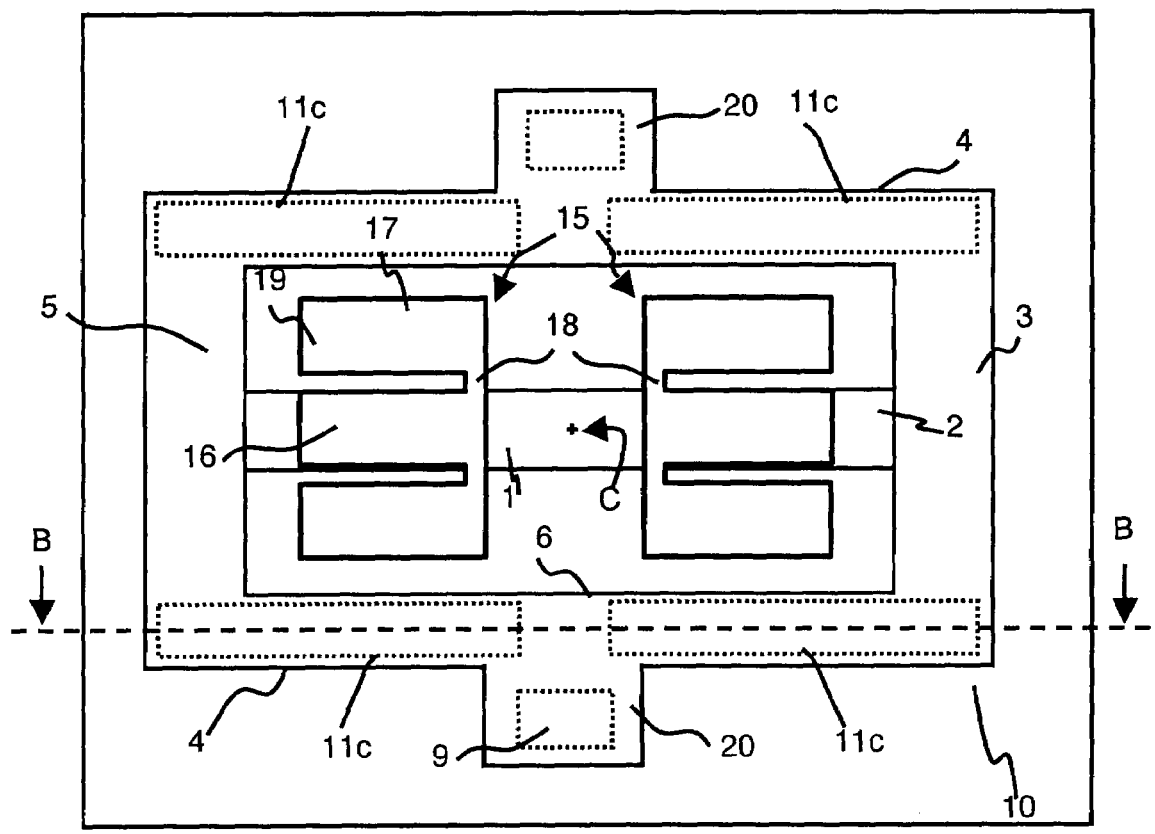
FIGS. 6 and 7 respectively illustrate another specific embodiment of a device according to the invention, in top view and in cross-section along the line B-B.

In FIG. 6, the second actuators 15 of a microswitch comprise actuating electrodes each comprising, transversely to the beam 1, a central zone 16 arranged on the beam 1 and two salient flexible side wings 17. Each side wing 17 is attached to the corresponding central zone 16 by a narrower connecting zone 18 arranged on one side of the wing 17 closer to the centre C of the beam 1. When an electric actuating voltage is applied between the actuating electrodes of the second actuators 15 and counter-electrodes arranged on the support 10, the free ends 19 of the side wings 17 flex in the direction of the support 10 and the electrostatic attractive force at the free ends 19 therefore increases. The free ends 19 thus flex further and urge the beam 1 in the direction of the support 10, the corresponding force between the wings 17 and the beam 1 being transmitted by means of the connecting zones 18. Adding the side wings 17 enables the electric actuating voltage of the switch to be further reduced.

In FIG. 6, the middle part 6 of each arm 4 comprises a lateral extension 20. The lateral extensions 20 are for example disposed in the plane of the frame 3 and the support blocks 9 are disposed under the lateral extensions 20 of the arms 4. The middle parts 6 are thus connected to the support blocks by means of the lateral extensions 20. It can also be envisaged to attach the lateral extension 20 directly to the base support 10 so that the beam 1 and at least the ends 5 of the arms 4 are separated from the base support 10. The lateral extensions 20 can for example themselves form a support block. The support 10 can comprise a cavity arranged facing the mobile beam 1.

Figure 7:
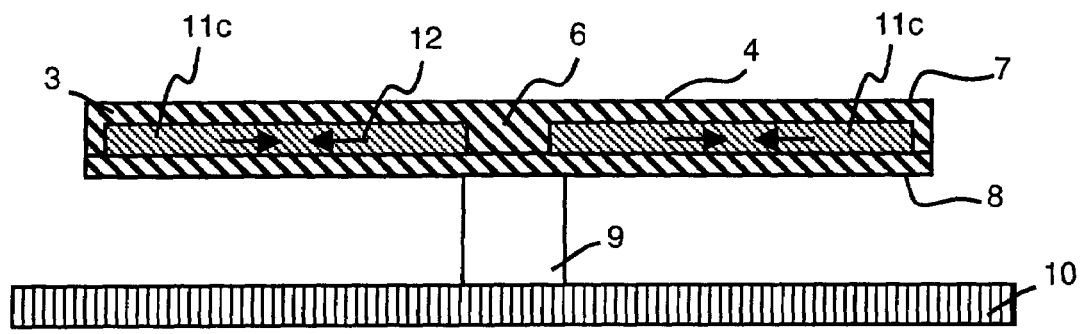

In FIG. 6, four stressed elements 11c are integrated in the frame 3, respectively two in each arm 4. The two elements 11c of an arm 4 are respectively disposed on each side of the middle part 6 of the arm 4, between the middle part 6 and the corresponding end 5. As represented in FIG. 7, the two elements 11c are centred between the front face 7 and the rear face 8 of the corresponding arm 4 so that the stresses essentially create longitudinal forces in the arms 4 enabling any bimetal type effect to be avoided. It is then important to arrange the elements 11c symmetrically with respect to the neutral fibre of the arms 4, i.e. with respect to the middle of the suspended assembly. The elements 11c are preferably active elements, for example thermal elements, expanding when an electric current flows. The elements 11c can present a shape comprising meanders. To strengthen the frame 3, one or more additional layers can be disposed between the elements 11c on the one hand, and the material respectively forming the front face 7 and the rear face 8 of the arms 4 on the other hand.

The second actuators 15 can also be disposed in such a way as to be centred between the corresponding front and rear faces, i.e. the front and rear faces of the beam 1. The beam 1 can also be strengthened by means of one or more additional layers disposed between the second actuators 15 on the one hand, and the material respectively constituting the front and rear faces of the beam 1 on the other hand. The second actuators 15 are thermal active elements preferably achieved at the same time as the elements 11.

In order to produce the device according to the invention, the mechanical characteristics (Young's modulus and Poisson's ratio) and the residual stresses of the thin layers that are to be used are first determined. This can be done experimentally or theoretically. Materials and thicknesses are chosen such as to ensure that the frame is very rigid with respect to the beam, i.e. such that the residual stresses from deposition of the material of the beam do not deform the frame. The geometric parameters of the beam that correspond the best to the intended application can be determined by means of a theoretical model, for example the mechanical model proposed in the article "On a tunable Bistable MEMS-Theory and Experiment" by M. T. A. Saif (J. Micromech. Syst., Vol. 9 no 2 June 2000, p. 157-170). In particular, a trade-off has to be found between the stability and the energy necessary for actuation. Then the assembly can be verified with a finite elements computing software, preferably by 3D computation. This enables operation of the device to be checked with a more precise geometry than the analytical model allows.

The invention is not limited to the embodiments represented. In particular, a combination of the passive or active first actuators with passive or active second actuators can be envisaged.

The invention claimed is:

1. A micromechanical device comprising:
a base support;
an annular frame parallel to the base support;
a mobile beam having two ends and forming a portion of the micromechanical device that can sag, the beam being attached via the two ends thereof to the annular frame, the beam having a predetermined stressed state; and
means for controlling the sag of the beam, perpendicular to the base support, comprising at least one stressed element belonging to the annular frame and enabling the state of stress of the beam to be adjusted,
wherein the annular frame is more rigid than the beam and comprises two arms, each arm of the annular frame having two ends respectively secured to the two ends of the mobile beam and each arm of the annular frame having a middle part arranged between the two ends of the corresponding arm, the arms and the middle parts of the arms presenting a front face and a rear face, the rear face of the middle part of each arm being attached to the base support and the ends of the arms being free from attachment to the base support.

2. The device according to claim 1, wherein the stressed element is formed by a tensile stressed thin layer.

3. The device according to claim 1, wherein the stressed element is formed by a compressive stressed thin layer.

4. The device according to claim 1, wherein the stressed element comprises a first actuator.

5. The device according to claim 4, wherein the first actuator is chosen from thermal actuators, piezoelectric actuators and electrostatic, electrostrictive, electromagnetic and magnetostrictive actuators.

6. The device according to claim 4, wherein the first actuator is formed by at least one thin layer.

7. The device according to claim 6, comprising means for applying an electric voltage between two ends of the thin layer constituting the first actuator.

8. The device according to claim 1, wherein the stressed element is centered between the front face and the rear face of the corresponding arm.

9. The device according to claim 1, wherein the annular frame comprises at least one pair of stressed elements, a front element and a rear element disposed facing one another respectively on the front face and on the rear face of the arms.

10. The device according to claim 9, wherein, the front and rear stressed elements of a pair of elements respectively exerting front and rear forces respectively on the front and rear faces of the corresponding arm, the front and rear forces exerted by the elements of a pair of elements are substantially equal.

11. according to claim 9, wherein each arm comprises two pairs of stressed elements, a front element and a rear element, respectively located on each side of the middle part of the corresponding arm.

12. The device according to claim 1, wherein the middle part of each arm comprises a lateral extension attached to the base support.

13. The device according to claim 1, wherein the rear face of the middle part of each arm is arranged on a support block securely affixed to the base support.

14. The device according to claim 1, wherein conducting elements are arranged respectively on a bottom face of the beam and on the base support so as to enable an electric contact to be established between said conducting elements, the device forming a microswitch.

* * * * *